(12) United States Patent
Jeon et al.

(10) Patent No.: US 11,107,868 B2
(45) Date of Patent: Aug. 31, 2021

(54) ORGANIC LIGHT EMITTING DISPLAY DEVICE

(71) Applicant: LG Display Co., Ltd., Seoul (KR)

(72) Inventors: Hongmyeong Jeon, Paju-si (KR); Kanghyun Kim, Paju-si (KR); Taeyong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/716,368

(22) Filed: Dec. 16, 2019

(65) Prior Publication Data
US 2020/0203449 A1 Jun. 25, 2020

(30) Foreign Application Priority Data
Dec. 19, 2018 (KR) .......................... 10-2018-0165490

(51) Int. Cl.
*H01L 27/32* (2006.01)
(52) U.S. Cl.
CPC ...... *H01L 27/3246* (2013.01); *H01L 27/3209* (2013.01); *H01L 27/3248* (2013.01)
(58) Field of Classification Search
None
See application file for complete search history.

(56) References Cited

U.S. PATENT DOCUMENTS

| 2012/0087003 A1* | 4/2012 | Sonoda | ............... G02F 1/167 359/296 |
| 2017/0117339 A1* | 4/2017 | Takata | ............. H01L 27/3246 |

(Continued)

FOREIGN PATENT DOCUMENTS

| JP | 2007-115529 A | 5/2007 |
| JP | 2016-503231 A | 2/2016 |

(Continued)

OTHER PUBLICATIONS

Taiwanese Office Action dated Sep. 23, 2020 issued in Patent Application No. 108144167 w/English Translation (15 pages).

(Continued)

*Primary Examiner* — Jay C Chang
(74) *Attorney, Agent, or Firm* — Polsinelli PC

(57) ABSTRACT

An organic light emitting display device comprises a substrate on which a plurality of sub-pixels is arranged in a column direction and a row direction; a plurality of first electrodes allocated to the plurality of sub-pixels; a first bank disposed on the first electrodes and having a plurality of first openings that exposes the plurality of first electrodes; and a second bank disposed on the first bank and having a plurality of second openings that exposes the plurality of first electrodes and a part of the first bank, wherein the plurality of first electrodes include a plurality of (1-1)-th electrodes arranged in a (3n-2)-th column, a plurality of (1-2)-th electrodes arranged in a (3n-1)-th column and a plurality of (1-3)-th electrodes arranged in a 3n-th column, where n is a natural number equal to or greater than 1, wherein the first bank is disposed between the plurality of first electrodes neighboring in the column direction and disposed between the (1-3)-th electrodes and the (1-1)-th electrodes neighboring in the row direction, wherein the second bank is disposed between the plurality of (1-1)-th electrodes arranged in the (3n-2)-th column and the plurality of (1-2)-th electrodes neighboring the plurality of (1-1)-th electrodes and arranged in the (3n-1)-th column and disposed between the plurality of (1-2)-th electrodes arranged in the (3n-1)-th column and the plurality of (1-3)-th electrodes neighboring the plurality of (1-2)-th electrodes and arranged in the 3n-th column, and wherein the second bank is not disposed between the plurality of (1-3)-th electrodes arranged in the 3n-th column and the plurality of (1-1)-th (Continued)

electrodes neighboring the plurality of (1-3)-th electrodes in the row direction and arranged in the (3n-2)-th column.

21 Claims, 19 Drawing Sheets

(56) References Cited

U.S. PATENT DOCUMENTS

2017/0287993 A1* 10/2017 Takata ................ H01L 51/0005
2018/0358573 A1    12/2018 Maeda et al.

FOREIGN PATENT DOCUMENTS

| JP | 2017-183201 A | 10/2017 |
|---|---|---|
| TW | 201438311 A | 10/2014 |

OTHER PUBLICATIONS

Japanese Office Action dated Nov. 24, 2020, issued in Patent Application No. 2019-222597 w/English Translation (13 pages).

* cited by examiner

ORGANIC LIGHT EMITTING DISPLAY DEVICE

CROSS REFERENCE TO RELATED APPLICATION

This application claims the priority benefit of Korean Patent Application No. 10-2018-0165490 filed on Dec. 19, 2018, which is hereby incorporated by reference in its entirety.

BACKGROUND

Field of the Disclosure

The present disclosure relates to an organic light emitting display device, and more particularly, to an organic light emitting display device that can improve display quality deterioration caused by a thickness deviation in an organic emission layer.

Description of the Background

Recently, various display devices which are light and compact and thus can supplement the weakness of cathode ray tubes have been developed. Such display devices include a liquid crystal display (LCD), a plasma display panel (PDP), a field emission display (FED), an organic light emitting display device, etc.

Light emitting display devices are spontaneous emission devices and have the advantages of a high response speed, high emission efficiency, high luminance and a wide viewing angle. Further, flexible display devices can be realized because elements can be formed on a flexible substrate such as a plastic substrate.

As large-area high-definition organic light emitting display devices are required, a single panel includes a plurality of sub-pixels. A mask is used for patterning of red, green and blue sub-pixels, in general. Accordingly, to realize large-area display devices, a large-area fine metal mask (FMM) corresponding thereto is needed. However, a mask is bent as the area thereof increases to causes various problems such as deposition of an organic light-emitting material forming an emission layer at an incorrect position.

To solve problems in a deposition method using the aforementioned mask, a solution process which is simple and suitable for large areas attracts interest. The solution process can perform large-area patterning through inkjet printing or nozzle printing without a mask and has a very high material use rate of about 50 to 80% compared to evaporation having a material use rate of less than 10%. In addition, the solution process has a higher glass transition temperature than evaporation and thus can provide high thermal stability and morphology property.

However, when an emission layer is formed through the solution process, a thickness deviation due to positions in sub-pixels may cause thickness non-uniformity, leading to considerable deterioration of display quality.

SUMMARY

The present disclosure provides an organic light emitting display device capable of improving display quality deterioration due to a thickness deviation in an organic emission layer.

In addition, the present disclosure provides an organic light emitting display device for preventing color mixing by modifying a bank structure.

An organic light emitting display device according to the present disclosure includes a substrate, first electrodes, a first bank, a second bank. A plurality of sub-pixels is arranged in a column direction and a row direction on the substrate. The first electrodes are allocated to the sub-pixels. The first bank is disposed on the first electrodes and has first openings for exposing a plurality of first electrodes. The second bank is disposed on the first bank and has second openings for exposing a plurality of first electrodes and a part of the first bank. The first electrodes include (1-1)-th electrodes arranged in a (3n-2)-th (n is a natural number equal to or greater than 1) column, (1-2)-th electrodes arranged in a (3n-1)-th column and (1-3)-th electrodes arranged in a 3n-th column. The first bank is disposed between the first electrodes neighboring in the column direction and disposed between the (1-3)-th electrode and the (1-1)-th electrode neighboring in the row direction. The second bank is disposed between the (1-1)-th electrodes arranged in the (3n-2)-th column and the (1-2)-th electrodes neighboring the (1-1)-th electrodes and arranged in the (3n-1)-th column and disposed between the (1-2)-th electrodes arranged in the (3n-1)-th column and the (1-3)-th electrodes neighboring the (1-2)-th electrodes and arranged in the 3n-th column, and the second bank is not disposed between the (1-3)-th electrodes arranged in the 3n-th column and the (1-1)-th electrodes neighboring the (1-3)-th electrodes in the row direction and arranged in the (3n-2)-th column.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principles of the disclosure.

In the drawings.

DETAILED DESCRIPTION

Hereinafter, the present disclosure will be described in detail through aspects with reference to the accompanying drawings. The same reference numbers will be used throughout this specification to refer to the same or like parts. In the following description of the present disclosure, a detailed description of known functions and configurations incorporated herein will be omitted when it may obscure the subject matter of the present disclosure. In description of various aspects, the same components may be representatively described at the beginning and omitted in other aspects.

In the following description of the aspects, "first" and "second" are used to describe various components, but such components are not limited by these terms. The terms are used to discriminate one component from another component.

Figure 1:
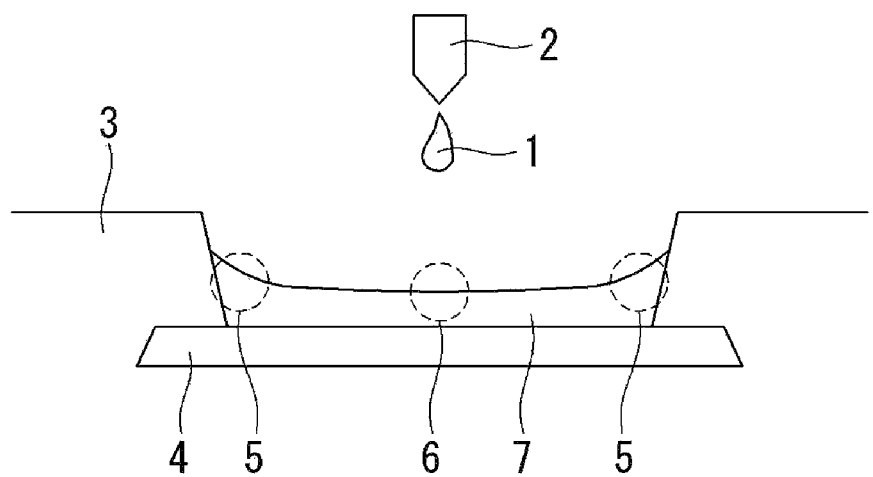
FIG. 1 is a diagram for describing problems of a solution process.

FIG. 1 is a diagram for describing problems of a solution process.

Referring to FIG. 1, when an organic emission layer is formed using the solution process (or, soluble process), pile up may occur to deteriorate the emission characteristic of an organic light emitting display device. More specifically, an organic light-emitting material 1 is dropped on a first electrode 4 defined by a bank 3 through an inkjet apparatus 2. The dropped organic light-emitting material 1 has a thickness deviation according to positions due to a hardening rate difference in the hardening process. That is, an organic emission layer 7 having a thick edge 5 in contact with the bank and a thin center 6 is formed.

When the organic emission layer 7 having an ununiform thickness is formed in this manner, a luminance deviation according to positions may occur to deteriorate display quality. Furthermore, a current density difference may be generated in the organic emission layer 7 to cause decrease in the lifespan of elements or dark spots may be generated to decrease process yield. In view of this, it is necessary to minimize an area in which pile up occurs in formation of an emission layer using the solution process.

Figure 2:
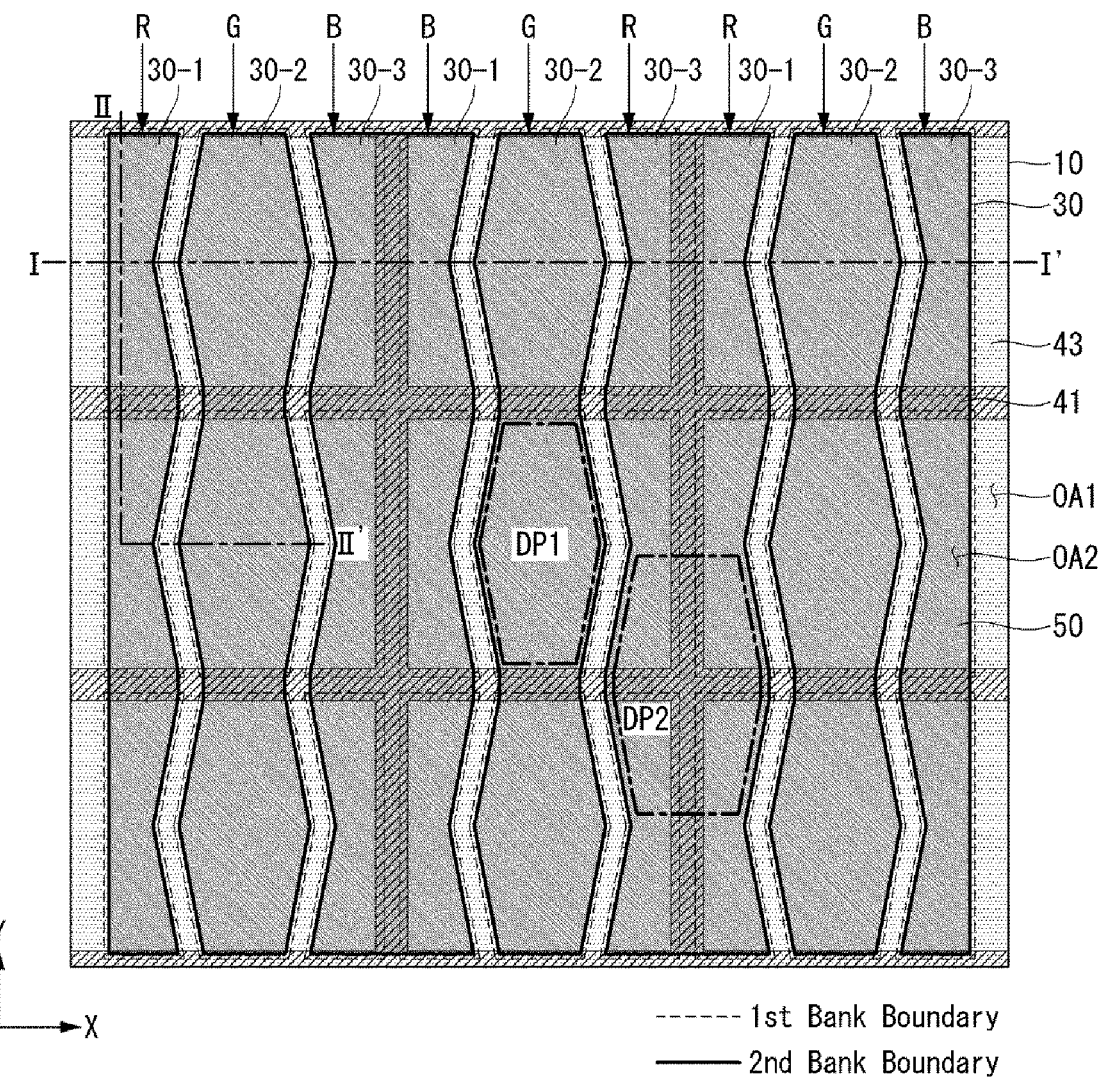
FIG. 2 is a schematic plan view showing an organic light emitting display device according to an aspect of the present disclosure.
Figure 3A:
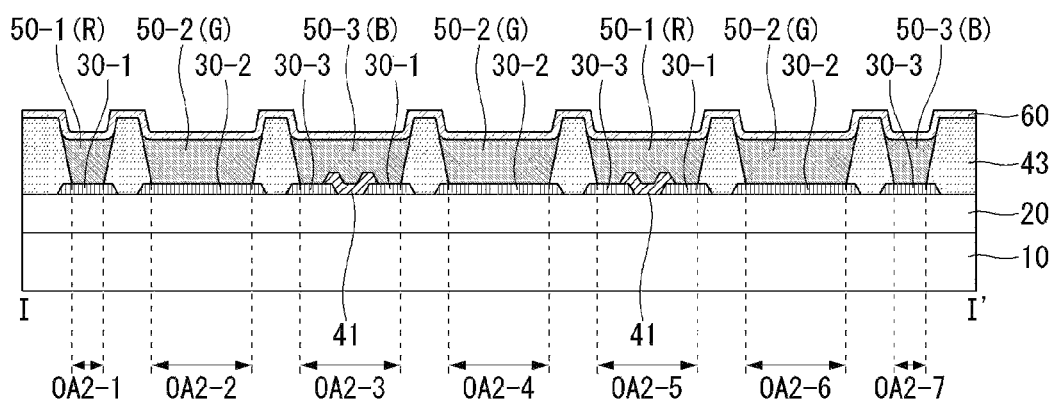
FIGS. 3A and 3B are cross-sectional views taken along lines I-I' and II-II' of FIG. 2.
Figure 3B:
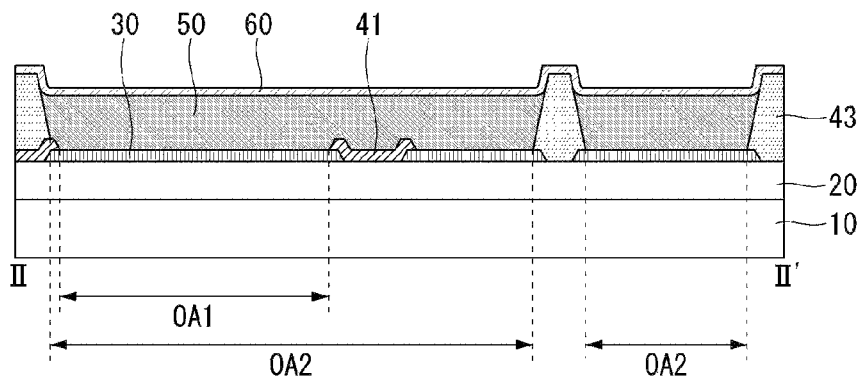
Figure 4:
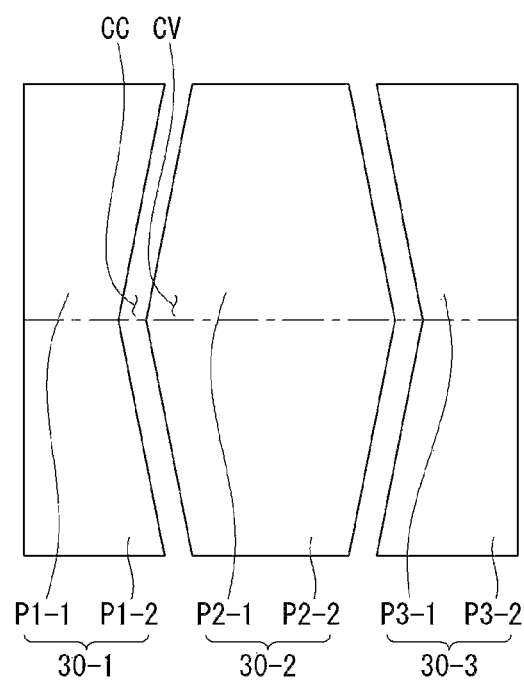
FIG. 4 is a diagram for describing shapes of first electrodes.

FIG. 2 is a schematic plan view showing an organic light emitting display device according to an aspect of the present disclosure. FIGS. 3A and 3B are cross-sectional views taken along lines I-I' and II-II' of FIG. 2. FIG. 4 is a diagram for describing shapes of first electrodes.

Referring to FIGS. 2 to 4, the organic light emitting display device according to an aspect includes a substrate 10 on which sub-pixels SP are arranged. A circuit element layer 20 and organic light-emitting diodes (OLEDs) driven by elements included in the circuit element layer 20 are arranged on the substrate 10.

The circuit element layer 20 may include signal lines and electrodes arranged therein, through which driving signals are applied to the OLEDs, and the signal lines and the electrodes may be separately disposed having at least one insulating layer interposed therebetween as necessary. When the organic light emitting display device is realized as an active matrix (AM) type, the circuit element layer 20 may further include transistors allocated per sub-pixel SP. Transistors may be realized in various structures such as top gate, bottom gate and double gate structures. Further, transistors may be realized as p-type or n-type transistors. A semiconductor layer forming transistors may include amorphous silicon, polysilicon or an oxide. Hereinafter, an OLED and a bank structure will be described first and then a specific transistor arrangement example will be described.

An OLED includes a first electrode 30, a second electrode 60, and an organic emission layer 50 interposed between the first electrode 30 and the second electrode 60. The first electrode 30 may be an anode and the second electrode 60 may be a cathode. The transistors included in the circuit element layer 20 may be connected to the first electrode 30.

A plurality of pixels is arranged on the substrate 10. Each pixel P may be composed of three sub-pixels SP expressing different colors. Sub-pixels SP may be arranged in a row direction (e.g., the X-axis direction) and a column direction (e.g., the Y-axis direction) which intersect each other. Sub-pixels SP consecutively disposed in the row direction may emit lights in different colors and sub-pixels SP consecutively disposed in the column direction may emit lights in the same color.

The sub-pixels SP may be sequentially alternately arranged in the row direction in units of a group. The group comprises a first sub-pixel emitting light in a first color, a second sub-pixel emitting light in a second color, a third sub-pixel emitting light in a third color, a fourth sub-pixel emitting light in the third color, a fifth sub-pixel emitting light in the second color and a sixth sub-pixel emitting light in the first color sequentially arranged in the row direction. Red, green and blue may be selected as the first, second and third colors, but the present disclosure is not limited thereto.

The first electrodes 30 of OLEDs are disposed in the sub-pixels SP. One first electrode 30 can be allocated to each sub-pixel SP.

The first electrodes 30 include (1-1)-th electrodes 30-1, (1-2)-th electrodes 30-2 and (1-3)-th electrodes 30-3. The (1-1)-th electrodes 30-1, the (1-2)-th electrodes 30-2 and the (1-3)-th electrodes 30-3 have different planar shapes.

The (1-1)-th electrodes 30-1 are disposed in a (3n-2)-th (n is a natural number equal to or greater than 1) column. The (1-1)-th electrodes 30-1 are sequentially disposed in the column direction. The (1-2)-th electrodes 30-2 are disposed in a (3n-1)-th column. The (1-2)-th electrodes 30-2 are sequentially disposed in the column direction. The (1-3)-th electrodes 30-3 are disposed in a 3n-th column. The (1-3)-th electrodes 30-3 are sequentially disposed in the column direction. Accordingly, the (1-1)-th electrodes 30-1, the (1-2)-th electrodes 30-2 and the (1-3)-th electrodes 30-3 are sequentially alternately disposed in the row direction.

Each (1-1)-th electrode 30-1 has a concave portion CC on one side thereof neighboring the (1-2)-th electrode 30-2. The (1-1)-th electrode 30-1 includes a first part P1-1 and a second part P1-2. The first part P1-1 of the (1-1)-th electrode 30-1 decreases in width in the row direction in the column direction. The second part P1-2 of the (1-1)-th electrode 30-1 extends from the first part P1-1 and increases in width in the row direction in the column direction. The first part P1-1 and the second part P1-2 of the (1-1)-th electrode 30-1 may be axially symmetrical with respect to a virtual reference line extending in the row direction. The first part P1-1 and the second part P1-2 of the (1-1)-th electrode 30-1 may have a planar shape of a right-angled trapezoid.

Each (1-2)-th electrode 30-2 has a convex portion CV on one side thereof neighboring the (1-1)-th electrode 30-1 and the other side thereof neighboring the (1-3)-th electrode 30-3. The (1-2)-th electrode 30-2 includes a first part P2-1 and a second part P2-2. The first part P2-1 of the (1-2)-th electrode 30-2 increases in width in the row direction in the column direction. The second part P2-2 of the (1-2)-th electrode 30-2 extends from the first part P2-1 and decreases in width in the row direction in the column direction. The first part P2-1 and the second part P2-2 of the (1-2)-th electrode 30-2 may be axially symmetrical with respect to a virtual reference line extending in the row direction. The first part P2-1 and the second part P2-2 of the (1-2)-th electrode 30-2 may have a planar shape of an isosceles trapezoid.

Each (1-3)-th electrode 30-3 has a concave portion CC on one side thereof neighboring the (1-2)-th electrode 30-2. A first part P3-1 of the (1-3)-th electrode 30-3 decreases in width in the row direction in the column direction. A second part P3-2 of the (1-3)-th electrode 30-3 extends from the first part P3-1 and increases in width in the row direction in the column direction. The first part P3-1 and the second part P3-2 of the (1-3)-th electrode 30-3 may be axially symmetrical with respect to a virtual reference line extending in the row direction. The first part P3-1 and the second part P3-2 of the (1-3)-th electrode 30-3 may have a planar shape of a right-angled trapezoid.

The convex portions CV of the (1-2)-th electrode 30-2 face the concave portion CC of the (1-1)-th electrode 30-1 and the concave portion CC of the (1-3)-th electrode 30-3. The convex portions CV of the (1-2)-th electrode 30-2 may enter the concave portion CC of the (1-1)-th electrode 30-1 and the concave portion CC of the (1-3)-th electrode 30-3. The (1-1)-th and the (1-3)-th electrodes 30-1 and 30-3 which neighbor each other may be axially symmetrical with respect to a virtual reference line extending in the column direction.

A bank 40 is disposed on the substrate 10 on which the first electrodes 30 are formed. The bank 40 includes a first bank 41 and a second bank 43.

The first bank 41 includes a plurality of first openings OA1 that expose at least parts of the first electrodes 30. The first bank 41 may be disposed to cover one side of each first electrode 30 between neighboring first electrodes 30.

The plurality of first openings OA1 is disposed in parallel in the column direction and the row direction. The first openings OA1 extend in the row direction and simultaneously expose the (1-1)-th, (1-2)-th and (1-3)-th electrodes 30-1, 30-2 and 30-3 disposed in the row direction.

More specifically, the first bank 41 may be disposed between first electrodes 30 neighboring in the column direction to define (or, to partition) sub-pixels SP neighboring in the column direction. That is, the first bank 41 may be disposed between the (1-1)-th electrodes 30-1 neighboring in the column direction, between the (1-2)-th electrodes 30-2 neighboring in the column direction and the (1-3)-th electrodes 30-3 neighboring in the column direction. In addition, the first bank 41 may be disposed between the (1-3)-th electrode 30-3 and the (1-1)-th electrode 30-1 which neighbor in the row direction to define sub-pixels SP neighboring in the row direction.

The first bank 41 may be formed relatively thin such that it can be covered by the organic emission layer 50 which will be formed later. The first bank 41 may have hydrophilicity. For example, the first bank 41 may be formed of a hydrophilic inorganic insulating material such as silicon oxide (SiO2) or silicon nitride (SiNx). The first bank 41 is a hydrophilic thin film provided in order to prevent poor wettability of the first electrodes 30 due to hydrophobicity thereof and allows hydrophilic organic light-emitting materials to well spread.

Although an example in which the first openings OA1 have an approximately rectangular shape is shown in the figures, the present disclosure is not limited thereto. Further, although the figures show that the first openings OA1 have the same shape and the same area, the present disclosure is not limited thereto and at least one first opening OA1 may have a shape and/or an area different from those of another first opening OA1.

The second bank 43 is positioned on the substrate 10 on which the first bank 41 is formed. The second bank 43 includes a plurality of second openings OA2 that expose at least parts of the first electrodes 30. The plurality of second openings OA2 is arranged in parallel in the row direction and extends in the column direction. The second openings OA2 extend in the column direction to expose the plurality of first electrodes 30 disposed in the column direction. The width of the second bank 43 may be selected as a minimum processable width that is set such that organic light-emitting materials in different colors dropped to neighboring second openings OA2 are not mixed.

More specifically, the second bank 43 is disposed between (1-1)-th electrodes 30-1 arranged in the (3n-2)-th column and (1-2)-th electrodes 30-2 arranged in the (3n-1)-th column. That is, sub-pixels disposed in the (3n-2)-th column and sub-pixels disposed in the (3n-1)-th column can be defined by the second bank 43. Here, the second bank 43 may extend zigzag in the column direction between the (1-1)-th electrodes 30-1 arranged in the (3n-2)-th column and the (1-2)-th electrodes 30-2 arranged in the (3n-1)-th column.

The second bank 43 is disposed between (1-2)-th electrodes 30-2 arranged in the (3n-1)-th column and (1-3)-th electrodes 30-3 arranged in the 3n-th column adjacent thereto. That is, sub-pixels disposed in the (3n-1)-th column and sub-pixels disposed in the 3n-th column can be defined by the second bank 43. Here, the second bank 43 may extend zigzag in the column direction between the (1-2)-th electrodes 30-2 arranged in the (3n-2)-th column and the (1-3)-th electrodes 30-3 arranged in the 3n-th column.

The second bank 43 is not disposed between (1-3)-th electrodes 30-3 arranged in the 3n-th column and (1-1)-th electrodes 30-1 arranged in the (3n-2)-th column adjacent thereto in the row direction. That is, the (1-3)-th electrodes 30-3 and the (1-1)-th electrodes 30-1 can be simultaneously exposed through one second opening in areas in which the (1-3)-th electrodes 30-3 neighbor the (1-1)-th electrodes 30-1 in the row direction. That is, the sub-pixels disposed in the 3n-th column and the sub-pixels disposed in the (3n-2)-th column are not defined (or not partitioned) by the second bank 43.

For example, the second openings OA2 may include (2-1)-th openings OA2-1, (2-2)-th openings OA2-2, (2-3)-th openings OA2-3, (2-4)-th openings OA2-4, (2-5)-th openings OA2-5, (2-6)-th openings OA2-6, and (2-7)-th openings OA2-7 arranged in the row direction, as shown. The (2-1)-th openings OA2-1 expose the (1-1)-th electrodes 30-1 disposed in the first column. The (2-2)-th openings OA2-2 expose the (1-2)-th electrodes 30-2 disposed in the second column. The (2-3)-th openings OA2-3 simultaneously expose the (1-3)-th electrodes 30-3 disposed in the third column and the (1-1)-th electrodes 30-1 disposed in the fourth column. The (2-4)-th openings OA2-4 expose the (1-2)-th electrodes 30-2 disposed in the fifth column. The (2-5)-th openings OA2-5 simultaneously expose the (1-3)-th electrodes 30-3 disposed in the sixth column and the (1-1)-th electrodes 30-1 disposed in the seventh column. The (2-6)-th openings OA2-6 expose the (1-2)-th electrodes 30-2 disposed in the eighth column. The (2-7)-th openings OA2-7 expose the (1-3)-th electrodes 30-3 disposed in the ninth column.

Regions of the second openings which expose the (1-2)-th electrodes 30-2 can be set to be relatively large to correspond to the areas of the (1-2)-th electrodes 30-2 and thus can be allocated to areas DP1 to which an organic light-emitting material is dropped in a solution process. In addition, regions of the second openings which simultaneously expose the (1-3)-th electrodes 30-3 and the (1-1)-th electrodes 30-1 can be set to be relatively large to correspond to the areas of the (1-3)-th electrodes 30-3 and the (1-1)-th electrodes 30-1 and thus can be allocated to areas DP2 to which the organic light-emitting material is dropped in the solution process. Accordingly, a problem of color mixing occurring between neighboring sub-pixels SP due to incorrect positions at which the organic light-emitting material is dropped can be minimized.

Parts of the first electrodes 30 exposed according to a combination structure of the first bank 41 and the second bank 43 can be defined as emission regions. The planar shape of the emission regions may correspond to the planar shape of the first electrodes 30.

The second bank 43 may have hydrophobicity. For example, the second bank 43 may have a structure in which a hydrophobic material is coated on an organic insulating material and may be formed of an organic insulating material containing a hydrophobic material. According to the hydrophobicity of the second bank 43, the organic light-emitting material forming the organic emission layer 50 can concentrate on the centers of the emission regions. Further, the second bank 43 can serve as a barrier for confining organic light-emitting materials dropped to corresponding regions in the regions such that organic light-emitting materials having different colors can be prevented from being mixed. That is, the second bank 43 prevents organic light-emitting materials having different colors dropped to neighboring second openings OA2 from being mixed.

The organic emission layer 50 is positioned on the substrate 10 on which the second bank 43 is formed. The organic emission layer 50 may be formed in a direction in which the second opening OA2 extends within the corresponding second opening OA2. That is, an organic light-emitting material dropped to one second opening OA2 covers the first electrodes 30 and the first bank 41 exposed through the second opening OA2. The organic emission layer 50 formed in the second opening OA2 maintains continuity on the first bank 41 without being physically separately by the first bank 41 after the hardening process.

Organic light-emitting materials in the same color are dropped to the plurality of first electrodes 30 exposed through one second opening OA2. This means that a plurality of sub-pixels SP allocated to a position corresponding to one second opening OA2 emits lights in the same color. The planar shape of the organic emission layer 50 may correspond to the planar shape of the second opening OA2.

Organic light-emitting materials in different colors can be respectively dropped to second openings OA2 corresponding thereto. For example, the organic emission layer 50 may include a first organic emission layer 50-1 emitting light in a first color, a second organic emission layer 50-2 emitting light in a second color and a third organic emission layer 50-3 emitting light in a third color. The first organic emission layer 50-1 may be formed in the (2-1)-th openings OA2-1 that expose the (1-1)-th electrodes 30-1 disposed in the first column. The second organic emission layer 50-2 may be formed in the (2-2)-th openings OA2-2 that expose the (1-2)-th electrodes 30-2 disposed in the second column. The third organic emission layer 50-3 may be formed in the (2-3)-th openings OA2-3 that simultaneously expose the (1-3)-th electrodes 30-3 disposed in the third column and the (1-1)-th electrodes 30-1 disposed in the fourth column. The second organic emission layer 50-2 may be formed in the (2-4)-th openings OA2-4 that expose the (1-2)-th electrodes 30-2 disposed in the fifth column. The first organic emission layer 50-1 may be formed in the (2-5)-th openings OA2-5 that simultaneously expose the (1-3)-th electrodes 30-3 disposed in the sixth column and the (1-1)-th electrodes 30-1 disposed in the seventh column. The second organic emission layer 50-2 may be formed in the (2-6)-th openings OA2-6 that expose the (1-2)-th electrodes 30-2 disposed in the eighth column. The third organic emission layer 50-3 may be formed in the (2-7)-th openings OA2-7 that expose the (1-3)-th electrodes 30-3 disposed in the ninth column.

In the present disclosure, since organic light-emitting materials can spread to a uniform thickness over a wide area in the second openings OA2 extending in the column direction, thickness non-uniformity due to the aforementioned pile-up after hardening can be improved. Accordingly, the organic light emitting display device according to an aspect of the present disclosure can prevent deterioration in uniformity of the organic emission layer 50 to minimize display quality deterioration caused by a thickness deviation in the sub-pixels SP. In addition, uniformity of the organic emission layer 50 can be secured to prevent a decrease in the lifespan of elements and generation of dark spots.

Furthermore, the organic light emitting display device according to an aspect of the present disclosure can secure a sufficient area in which organic light-emitting materials are dropped, as described above, and thus can improve display quality deterioration due to color mixing.

FIGS. 5A to 8C are diagrams for describing processes of forming the first electrodes, banks and organic emission layers in chronological order.

Figure 5A:
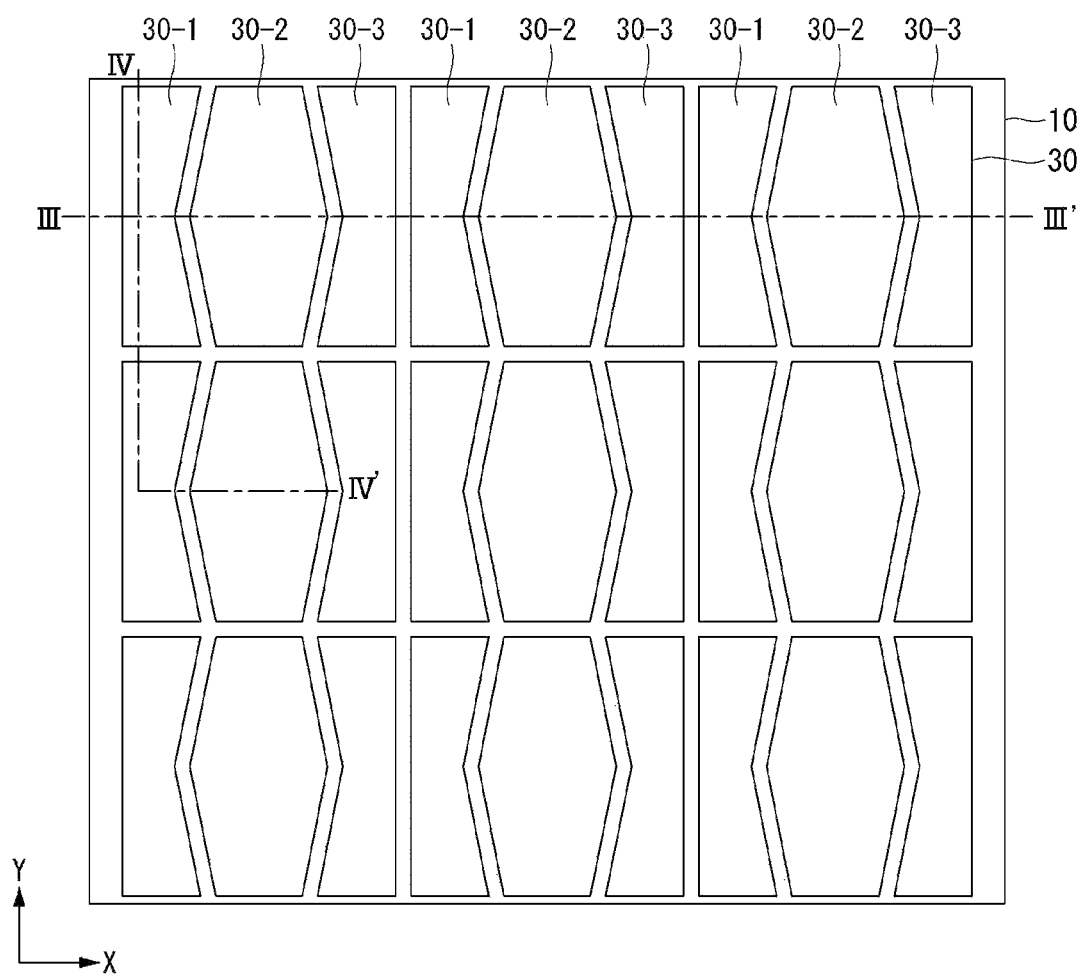
FIGS. 5A to 8C are diagrams for describing processes of forming the first electrodes, banks and an organic emission layer in chronological order.
Figure 5B:
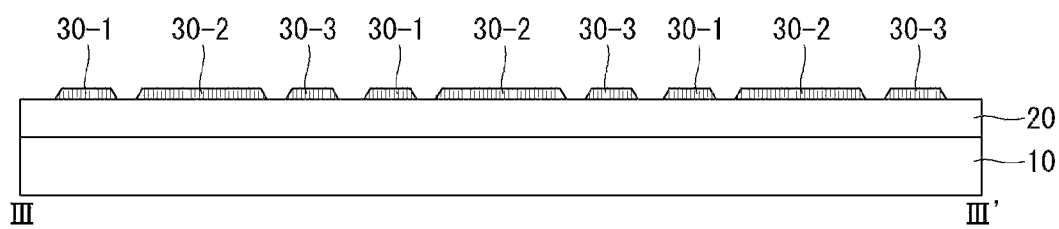
Figure 5C:
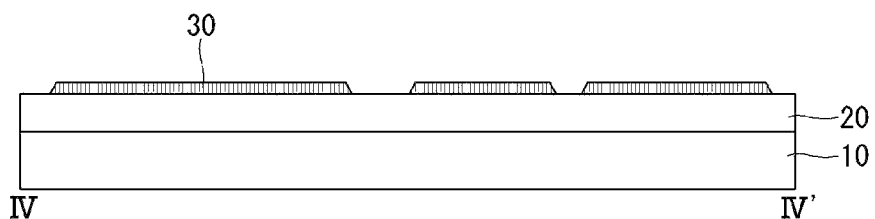

Referring to FIGS. 5A, 5B and 5C, the first electrodes 30 are formed on the substrate 10. The first electrodes 30 can be respectively allocated to sub-pixels SP. Although a case in which 7 sub-pixels are arranged in the row direction and 6 sub-pixels are arranged in the column direction will be described as an example below, the present disclosure is not limited thereto.

The first electrodes 30 includes (1-1)-th electrodes 30-1, (1-2)-th electrodes 30-2 and (1-3)-th electrodes 30-3. The (1-1)-th electrodes 30-1, the (1-2)-th electrodes 30-2 and the (1-3)-th electrodes 30-3 have different planar shapes.

The (1-1)-th electrodes 30-1 may be disposed in the first, fourth and seventh columns. The (1-2)-th electrodes 30-2 may be disposed in the second, fifth and eighth columns. The (1-3)-th electrodes 30-3 may be disposed in the third, sixth and ninth columns.

Figure 6A:
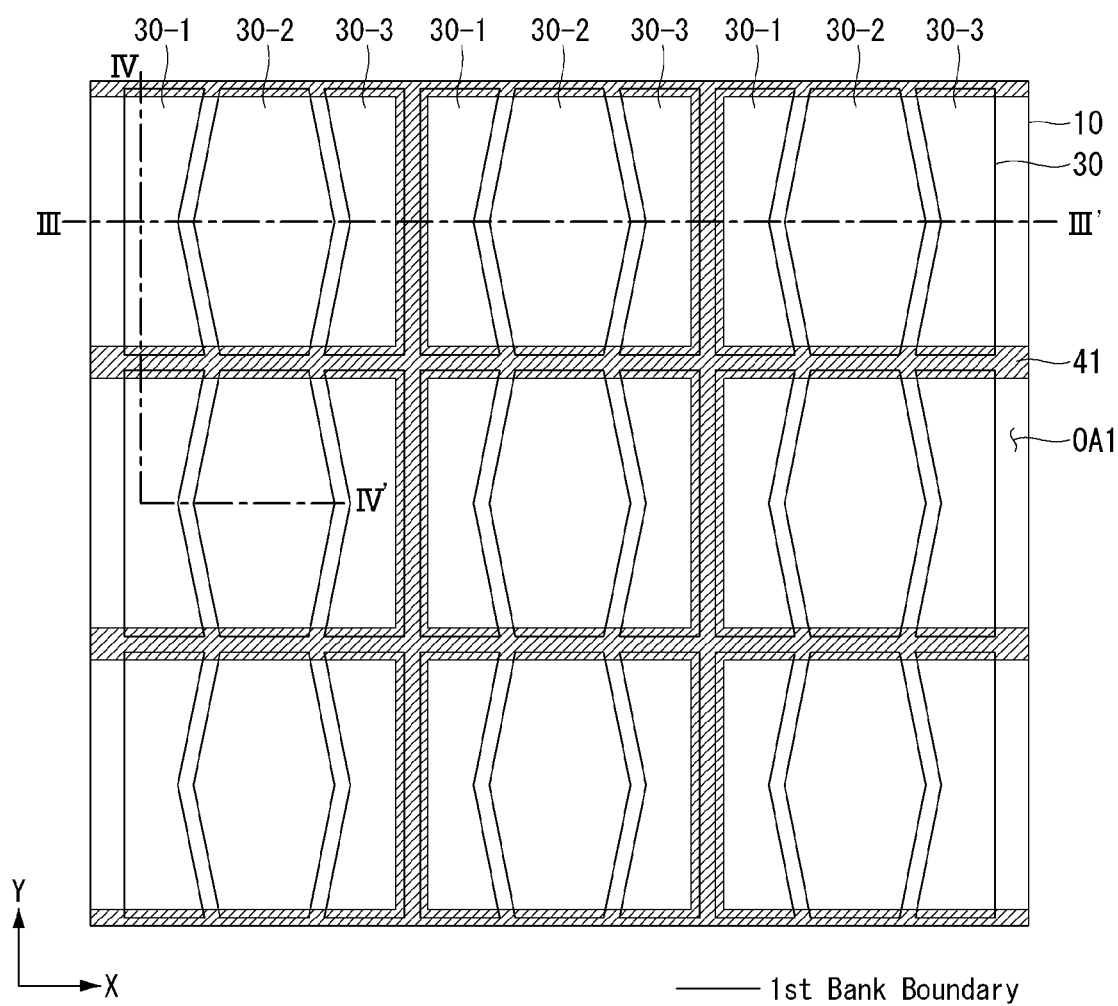
Figure 6B:
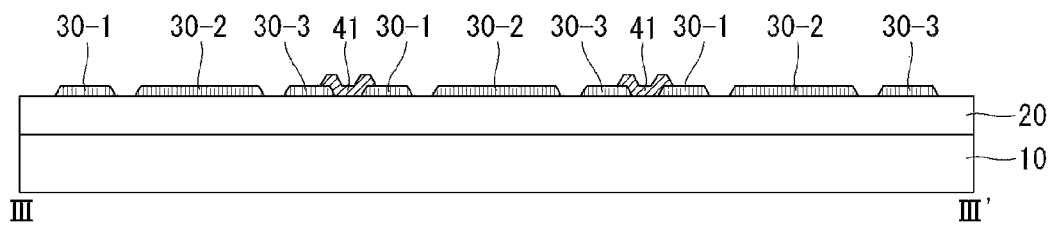
Figure 6C:
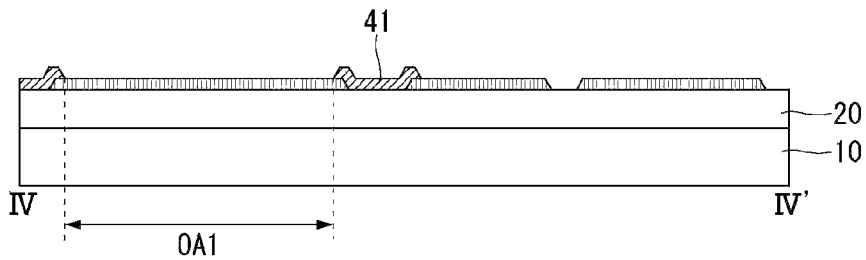

Referring to FIGS. 6A, 6B and 6C, the first bank 41 is formed on the substrate 10 on which the first electrodes 30 are formed. The first bank 41 includes the first openings OA1. Each first opening OA1 exposes a plurality of first electrodes 30 corresponding to one pixel. For example, the first opening OA1 can expose a set of the (1-1)-th electrode 30-1, the (1-2)-th electrode 30-2 and the (1-2)-th electrode 30-3.

Figure 7A:
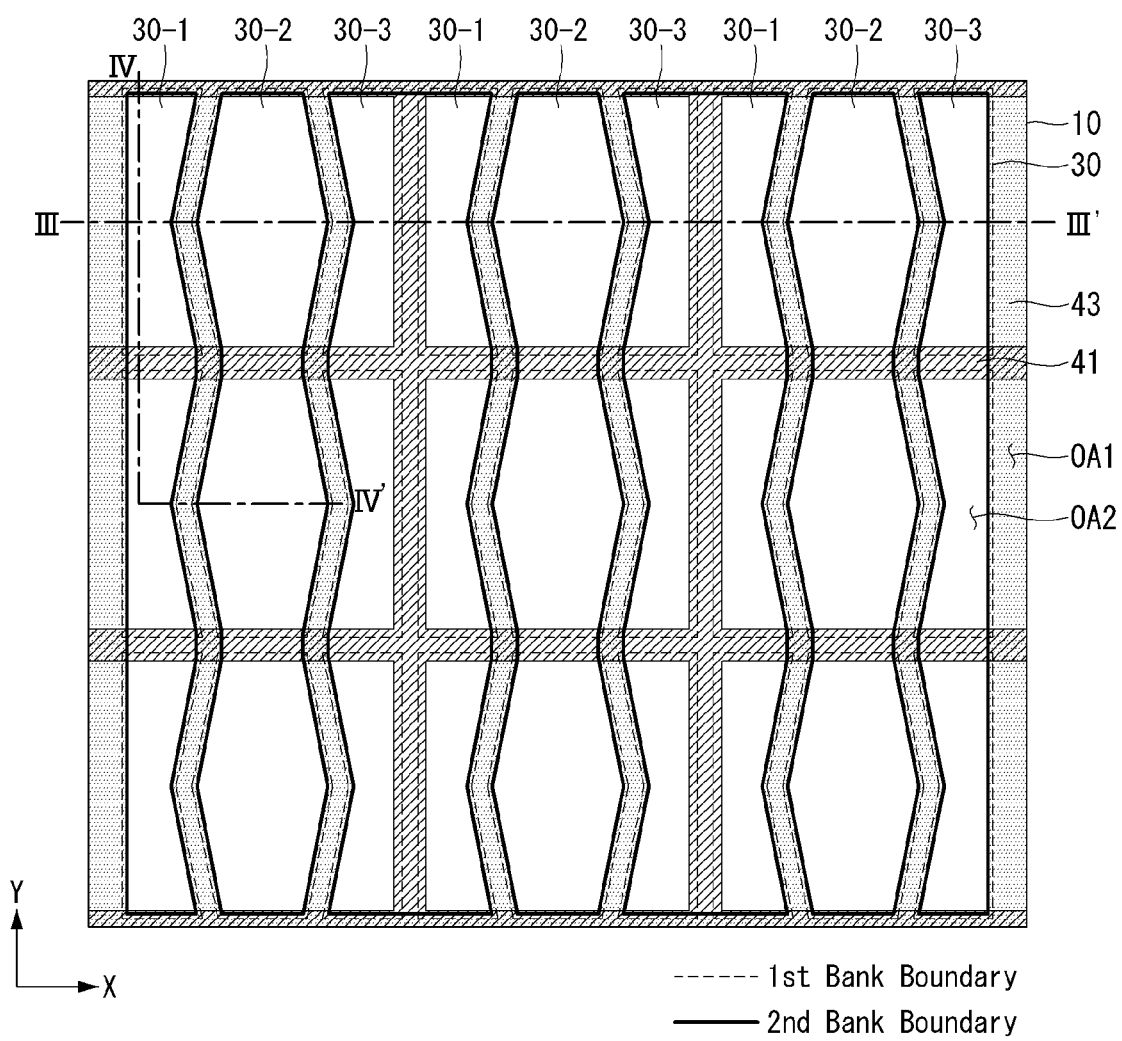
Figure 7B:
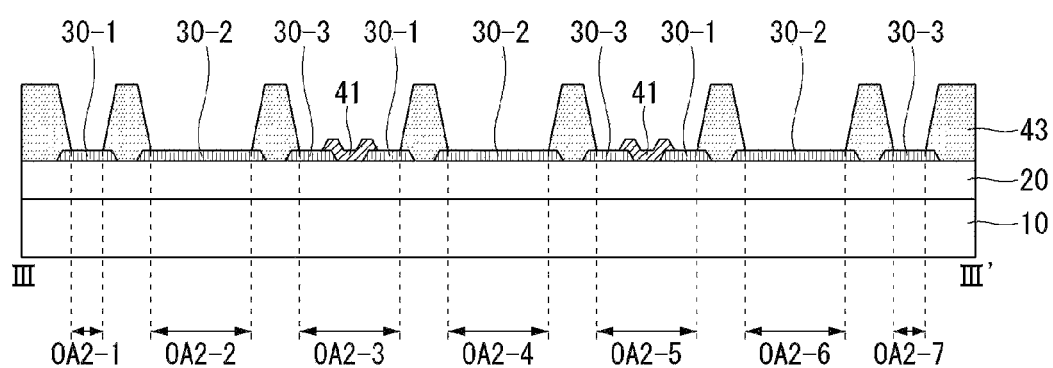
Figure 7C:
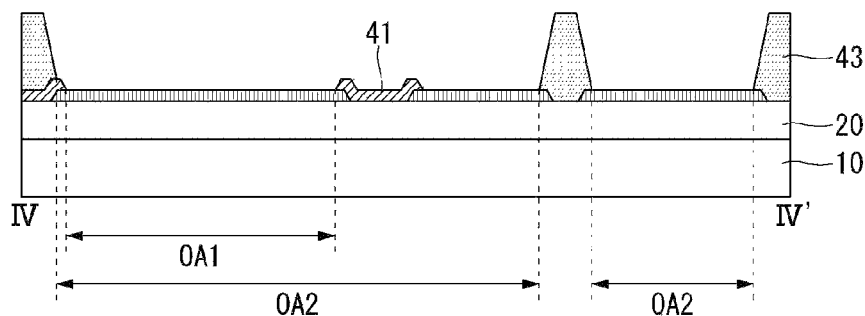

Referring to FIGS. 7A, 7B and 7C, the second bank 43 is formed on the substrate 10 on which the first bank 41 is formed. The second bank 43 includes the second openings OA2. The second openings OA2 expose a plurality of first electrodes 30 disposed in the column direction. Emission regions can be defined by the first bank 41 and the second bank 43.

For example, the second openings OA2 may include (2-1)-th openings OA2-1, (2-2)-th openings OA2-2, (2-3)-th openings OA2-3, (2-4)-th openings OA2-4, (2-5)-th openings OA2-5, (2-6)-th openings OA2-6, and (2-7)-th openings OA2-7 arranged in the row direction. The (2-1)-th openings OA2-1 expose the (1-1)-th electrodes 30-1 disposed in the first column. The (2-2)-th openings OA2-2 expose the (1-2)-th electrodes 30-2 disposed in the second column. The (2-3)-th openings OA2-3 simultaneously expose the (1-3)-th electrodes 30-3 disposed in the third column and the (1-1)-th electrodes 30-1 disposed in the fourth column. The (2-4)-th openings OA2-4 expose the (1-2)-th electrodes 30-2 disposed in the fifth column. The (2-5)-th openings OA2-5 simultaneously expose the (1-3)-th electrodes 30-3 disposed in the sixth column and the (1-1)-th electrodes 30-1 disposed in the seventh column. The (2-6)-th openings OA2-6 expose the (1-2)-th electrodes 30-2 disposed in the eighth column. The (2-7)-th openings OA2-7 expose the (1-3)-th electrodes 30-3 disposed in the ninth column.

Figure 8A:
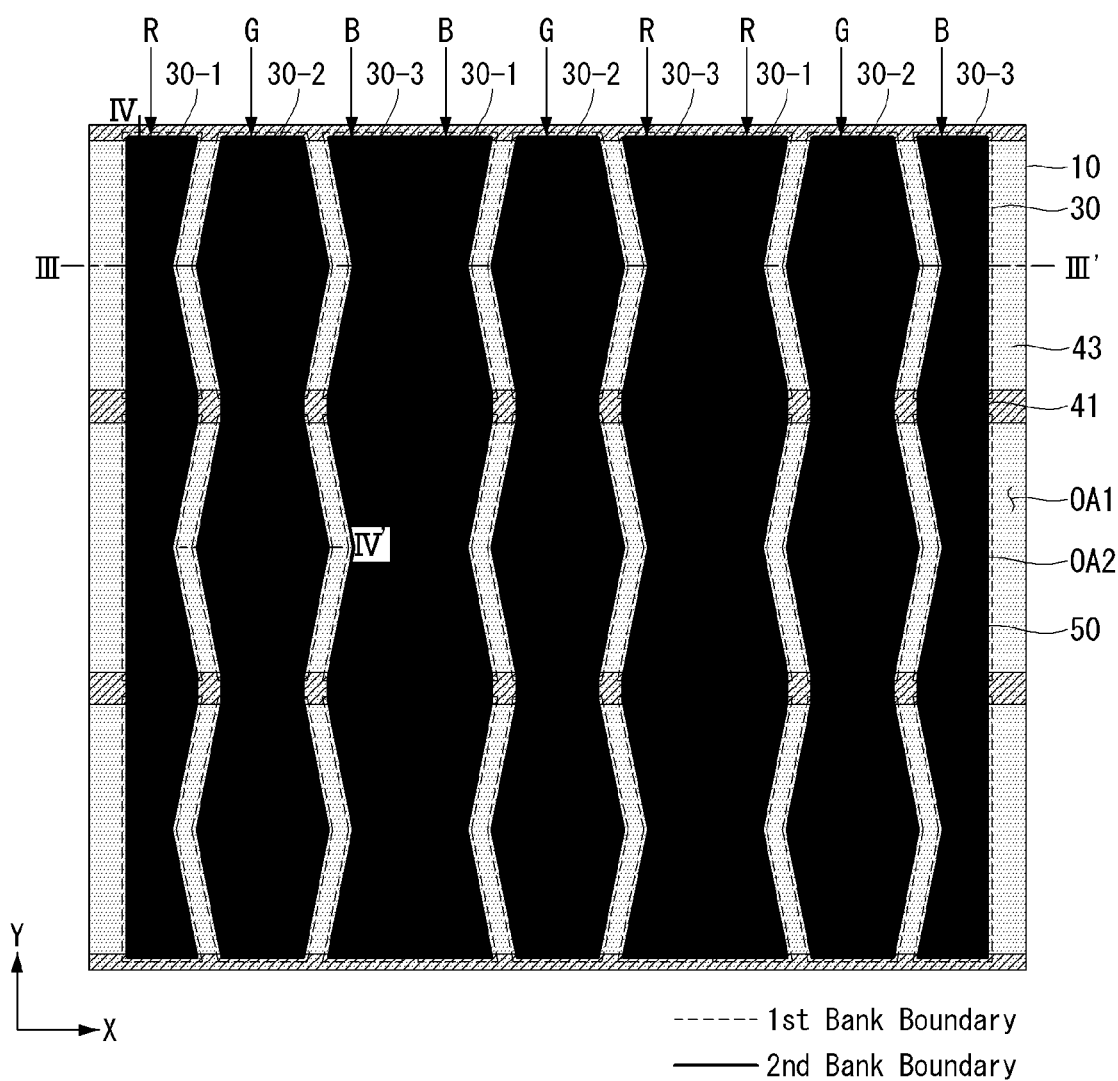
Figure 8B:
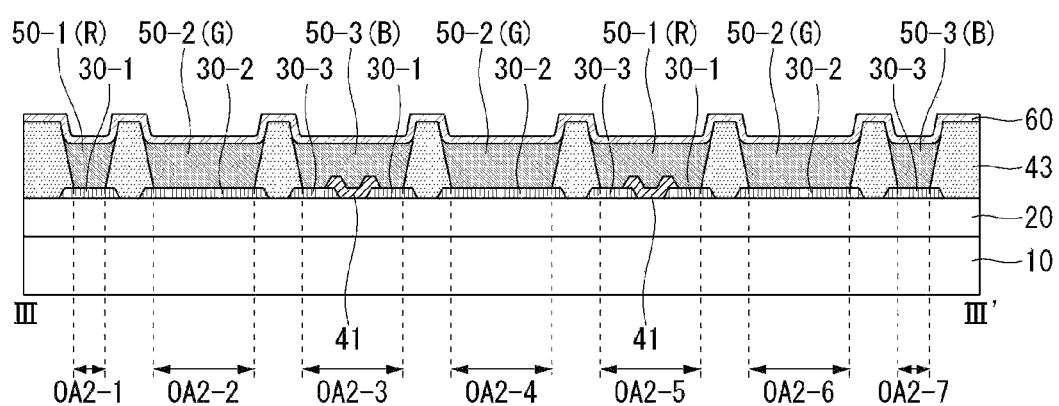
Figure 8C:
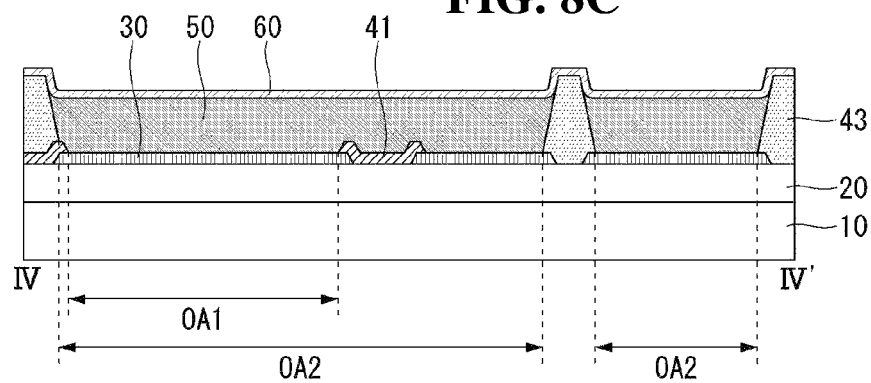

Referring to FIGS. 8A, 8B and 8C, the organic emission layer 50 and the second electrode 60 are sequentially formed on the substrate 10 on which the second bank 43 is formed.

The organic emission layer 50 may include the first organic emission layer 50-1 emitting light in the first color, the second organic emission layer 50-2 emitting light in the second color and the third organic emission layer 50-3 emitting light in the third color.

For example, the first organic emission layer 50-1 may be formed in the (2-1)-th openings OA2-1 and the (2-5)-th openings OA2-5. The second organic emission layer 50-2 may be formed in the (2-2)-th openings OA2-2, the (2-4)-th openings OA2-4 and the (2-6)-th openings OA2-6. The third organic emission layer 50-3 may be formed in the (2-3)-th openings OA2-3 and the (2-7)-th openings OA2-7.

<Application>

Figure 9:
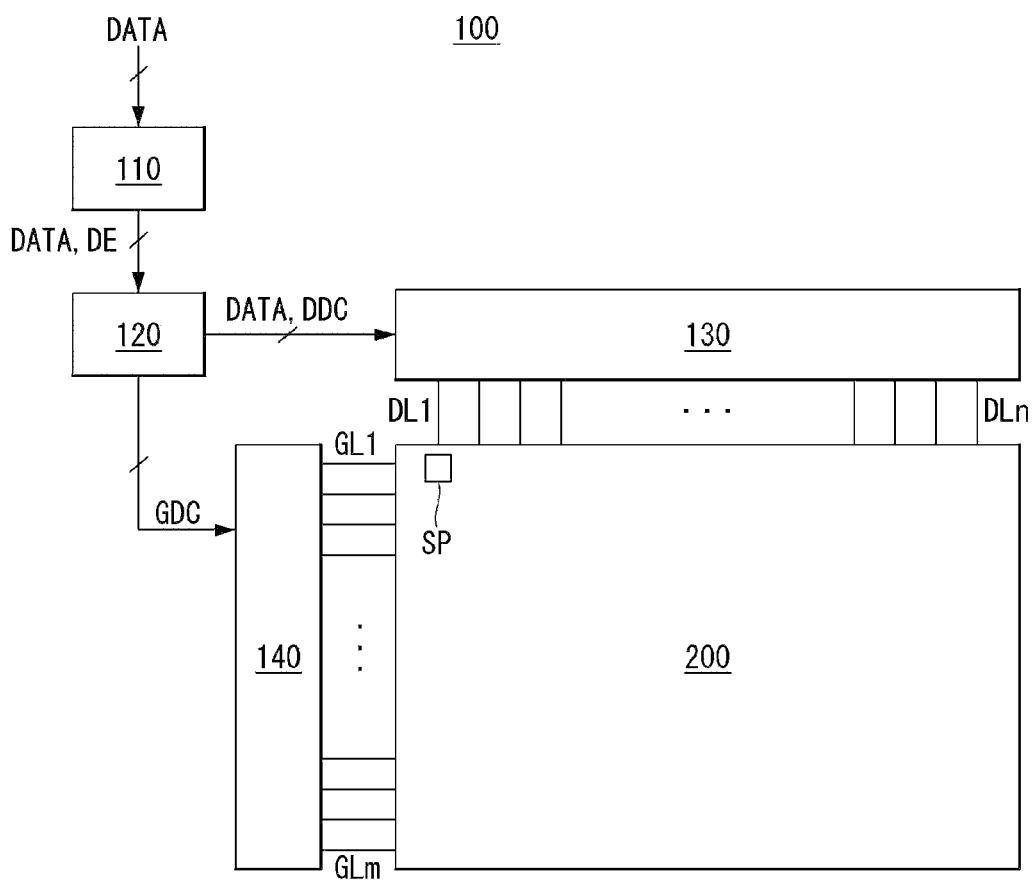
FIG. 9 is a schematic block diagram of an organic light emitting display device.
Figure 10:
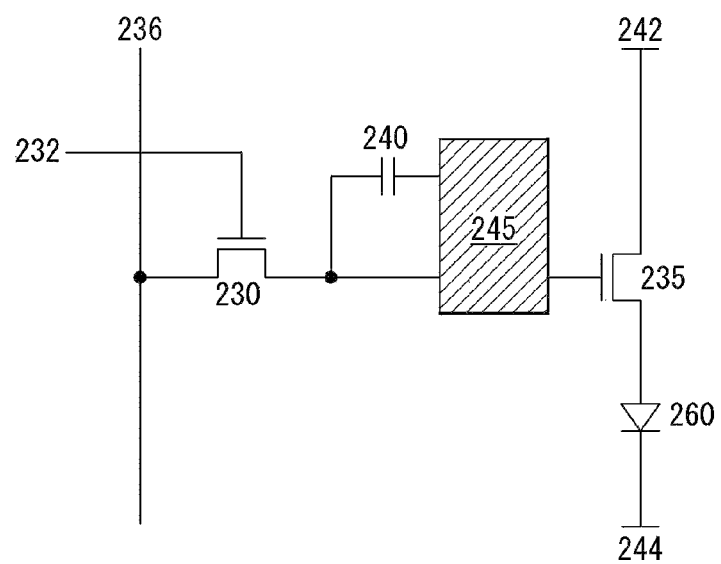
FIG. 10 is a schematic circuit diagram of a sub-pixel.
Figure 11:
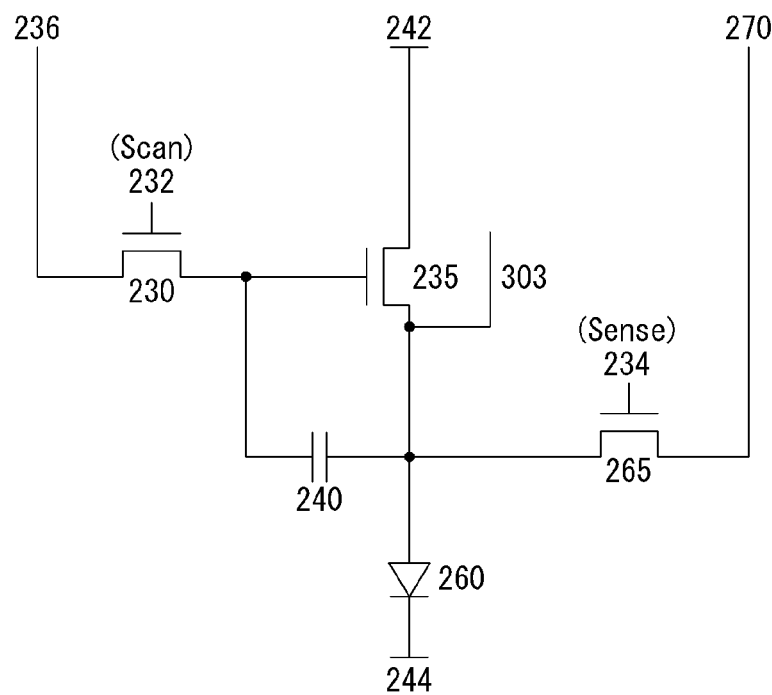
FIG. 11 is a detailed circuit diagram of the sub-pixel.

FIG. 9 is a schematic block diagram of an organic light emitting display device, FIG. 10 is a schematic circuit diagram of a sub-pixel and FIG. 11 is a detailed circuit diagram of the sub-pixel.

As shown in FIG. 9, an organic light emitting display device 100 includes an image processor 110, a timing controller 120, a data driver 130, a scan driver 140 and a display panel 200.

The image processor 110 outputs data signals DATA supplied from the outside, a data enable signal DE, etc. Although the image processor 110 may output one or more of a vertical synchronization signal, a horizontal synchronization signal and a clock signal in addition to the data enable signals DE, illustration of these signals is omitted for convenience of description.

The timing controller 120 receives the data signals DATA along with the data enable signal DE or driving signals including the vertical synchronization signal, the horizontal synchronization signal and the clock signal from the image processor 110. The timing controller 120 outputs a gate timing control signal GDC for controlling operation timing of the scan driver 140 and a data timing control signal DDC for controlling operation timing of the data driver 130 on the basis of the driving signals.

The data driver 130 samples and latches the data signals DATA supplied from the timing controller 120 in response to the data timing control signal DDC supplied from the timing controller 120 to convert the data signals DATA into gamma reference voltages and outputs the gamma reference voltages. The data driver 130 outputs the data signals DATA through data lines DL1 to DLn. The data driver 130 may be configured in the form of an integrated circuit (IC).

The scan driver 140 outputs scan signals in response to the gate timing control signal GDC supplied from the timing controller 120. The scan driver 140 outputs the scan signals through gate lines GL1 to GLm. The scan driver 140 may be configured in the form of an IC or formed in a gate in panel (GIP) structure.

The display panel 200 displays an image in response to the data signals DATA and the scan signals supplied from the data driver 130 and the scan driver 400. The display panel 200 includes sub-pixels SP operating to display an image.

As shown in FIG. 10, one sub-pixel includes a switching transistor 230, a driving transistor 235, a capacitor 240, a compensation circuit 245 and an organic light-emitting diode (OLED) 260.

The switching transistor 230 performs a switching operation such that a data signal supplied through a first data line 236 is stored in the capacitor 240 as a data voltage in response to a scan signal supplied through a first gate line 232. The driving transistor 235 operates to cause a driving current to flow between a power supply line 242 (high voltage) and a cathode power supply line 244 (low voltage) according to the data voltage stored in the capacitor 240. The OLED 260 operates to emit light according to the driving current generated by the driving transistor 235.

The compensation circuit 245 is a circuit added to the sub-pixel in order to compensate for the threshold voltage of the driving transistor 235. The compensation circuit 245 is composed of one or more transistors. The compensation circuit 245 is configured in various manners according to external compensation methods and an example of the configuration of the compensation circuit 245 is described as follows.

As shown in FIG. 11, the compensation circuit 245 includes a sensing transistor 265 and a sensing line 270 (or a reference line). The sensing transistor 265 is connected between the source electrode of the driving transistor 235 and the anode (hereinafter, a sensing node) of the OLED 260. The sensing transistor 265 operates to supply an initialization voltage (or a sensing voltage) transmitted through the sensing line 270 to the sensing node of the driving transistor 235 or to sense a voltage or current of the sensing node of the driving transistor 235 or the sensing line 270.

The switching transistor 230 has a first electrode connected to the first data line 236 and a second electrode connected to the gate electrode of the driving transistor 235. The driving transistor 235 has a first electrode connected to the power supply line 242 and a second electrode connected to the anode of the OLED 260. The capacitor 240 has a first electrode connected to the gate electrode of the driving transistor 235 and a second electrode connected to the anode of the OLED 260. The OLED 260 has the anode connected to the second electrode of the driving transistor 235 and the cathode connected to the second power supply line 244. The sensing transistor 265 has a first electrode connected to the sensing line 270 and a second electrode connected to the anode of the OLED 260 and the second electrode of the driving transistor 235.

Operating time of the sensing transistor 265 may be similar or equal to that of the switching transistor 230 according to an external compensation algorithm (or the configuration of the compensation circuit). For example, the gate electrode of the switching transistor 230 may be connected to the first gate line 232 and the gate electrode of the sensing transistor 265 may be connected to the second gate line 234. In this case, a scan signal Scan is transferred through the first gate line 232 and a sensing signal Sense is transferred through the second gate line 234. As another example, the first gate line 232 connected to the gate electrode of the switching transistor 230 and the second gate line 234 connected to the gate electrode of the sensing transistor 265 may be connected such that they are commonly shared.

The sensing line 270 can be connected to the data driver. In this case, the data driver can sense the sensing node of the sub-pixel and generate a sensing result for a non-display period or N frames (N is an integer equal to or greater than 1) in real time. Meanwhile, the switching transistor 230 and the sensing transistor 265 may be turned on at the same time. In this case, a sensing operation through the sensing line 270 is separated (distinguished) from a data output operation for outputting a data signal according to time division operation of the data driver.

In addition, a compensation target according to a sensing result may be a digital data signal, an analog data signal or a gamma. Further, the compensation circuit for generating a compensation signal (or a compensation voltage) on the basis of a sensing result may be realized in the data driver or the timing controller, or realized as a separate circuit.

A light shielding layer 303 may be disposed only under a channel region of the driving transistor 235 or under channel regions of the switching transistor 230 and the sensing transistor 265 as well as the channel region of the driving transistor 235. The light shielding layer 303 may be used to simply block external light or used as an electrode that is connected to another electrode or a line and forms a capacitor. Accordingly, a multi-level metal layer (multiple layers of dissimilar metals) having a light shielding property is selected as the light shielding layer 303.

Although a sub-pixel having a 3-transistor 1-capacitor (3T1C) structure including the switching transistor 230, the driving transistor 235, the capacitor 240, the OLED 260 and the sensing transistor 265 has been described as an example in FIG. 11, a sub-pixel may be configured in 3T2C, 4T2C, 5T1C, 6T2C, or the like when the compensation circuit 245 is added.

Figure 12:
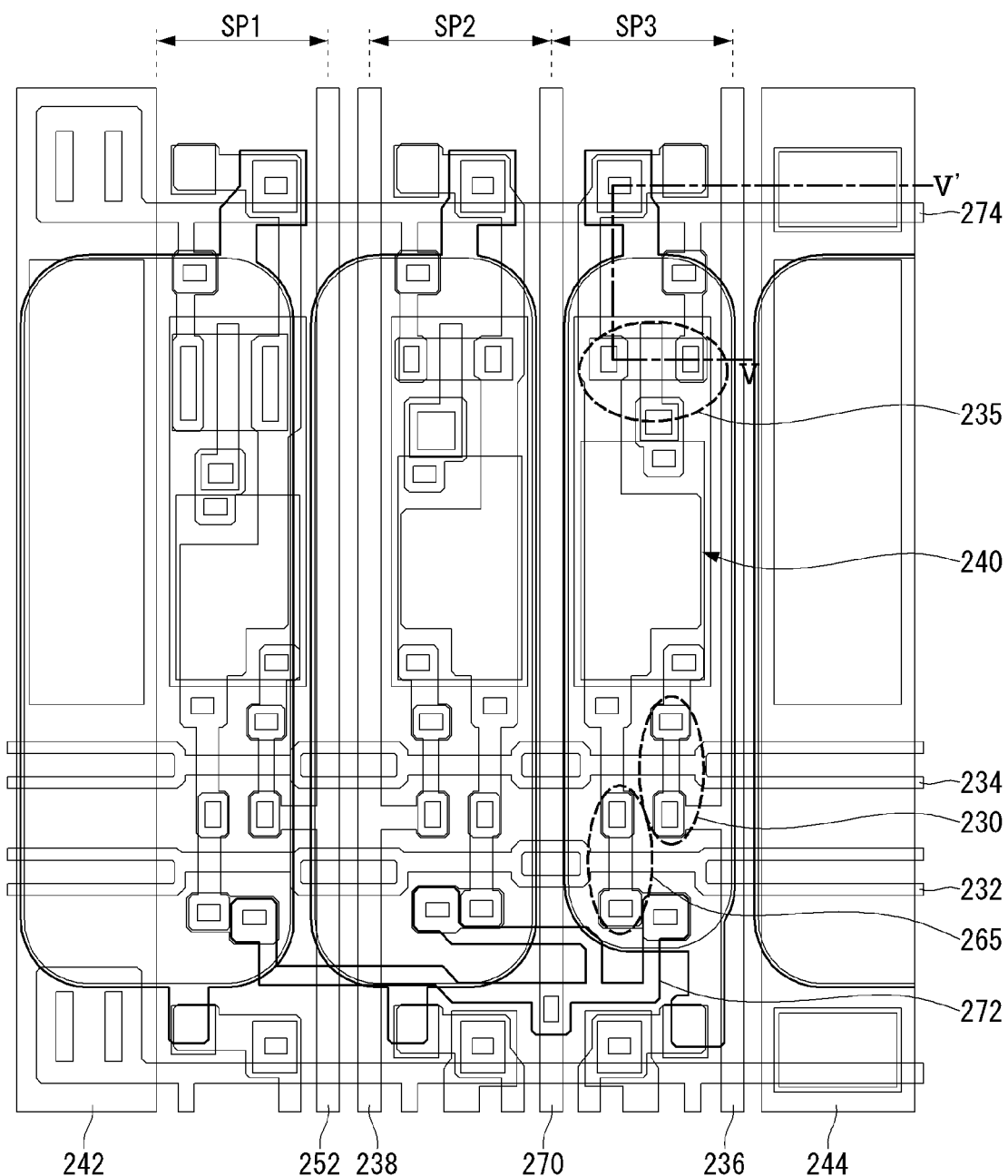
FIG. 12 is a schematic diagram showing a layout of sub-pixels according to the present disclosure.
Figure 13:
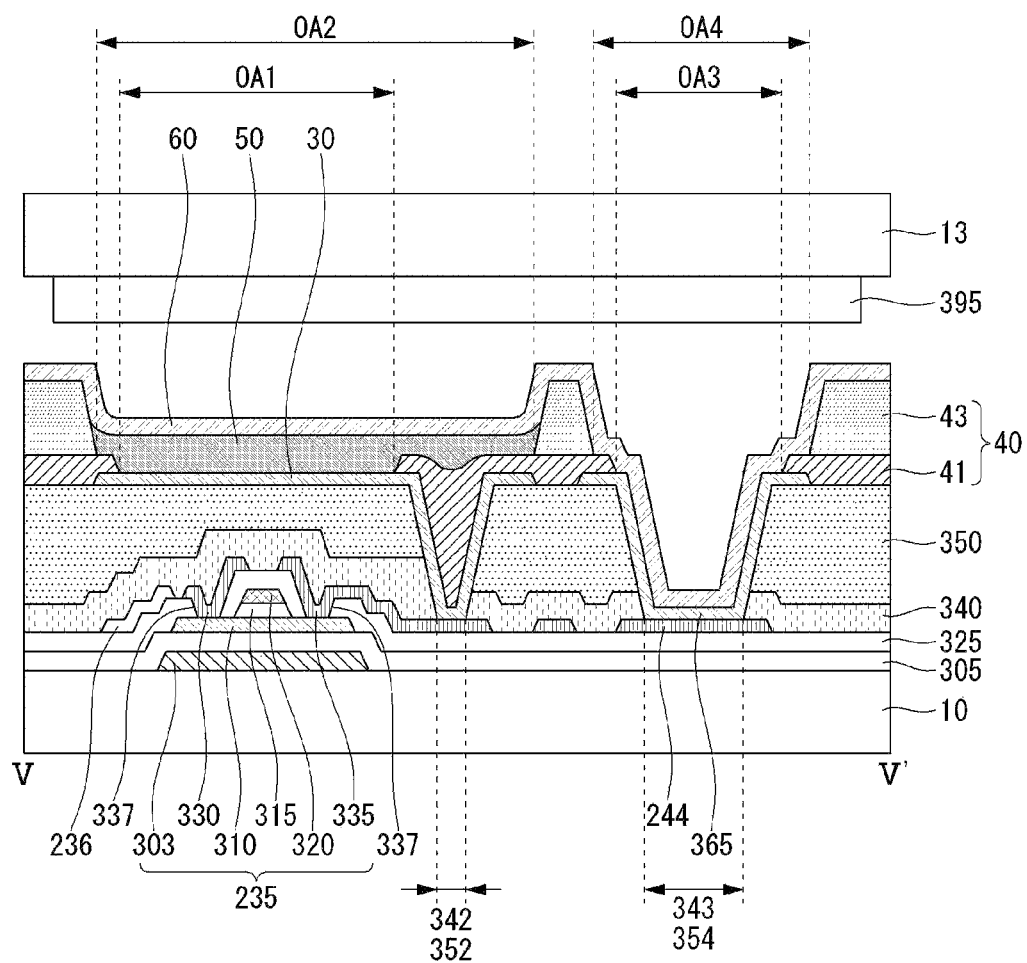
FIG. 13 is a cross-sectional view taken along line V-V' of FIG. 12.

FIG. 12 is a schematic diagram showing a layout of sub-pixels according to the present disclosure. FIG. 13 is a cross-sectional view taken along line V-V' of FIG. 12.

Referring to FIG. 12, a first sub-pixel SP1, a second sub-pixel SP2 and a third sub-pixel SP3 are formed on a display area of a substrate. An OLED (a light-emitting element) and a circuit that includes the switching transistor 230, the sensing transistor 265 and the driving transistor 235 and drives the OLED are formed in each of the first, second and third sub-pixels SP1, SP2 and SP3. In each of the first, second and third sub-pixels SP1, SP2 and SP3, the OLED emits light in response to operations of the switching transistor 230, the sensing transistor 265 and the driving transistor 235. The power supply line 242, the sensing line 270, and first to third data lines 236, 238 and 252 are disposed between the first, second and third sub-pixels SP1, SP2 and SP3. First and second gate lines 232 and 234 are disposed to intersect the first, second and third sub-pixels SP1, SP2 and SP3.

Electrodes constituting thin film transistors as well as interconnection lines such as the power supply line 242, the sensing line 270 and the first to third data lines 236, 238 and 252 are disposed at different levels but they are electrically connected through contact holes (via holes). The sensing line 270 is connected to the sensing transistor 265 of each of the first, second and third sub-pixels SP1, SP2 and SP3 through a sensing connection line 272. The power supply line 242 is connected to the driving transistor 235 of each of the first, second and third sub-pixels SP1, SP2 and SP3 through a power connection line 74. The first and second gate lines 232 and 234 are connected to the sensing transistor 265 and the switching transistor 230 of each of the first, second and third sub-pixels SP1, SP2 and SP3.

The aforementioned first sub-pixel SP1 may be a red sub-pixel, the second sub-pixel SP2 may be a green sub-pixel, and the third sub-pixel SP3 may be a blue sub-pixel. However, the positions of the sub-pixels may be changed.

A cross-sectional structure of the first sub-pixel among the first to third sub-pixels will be described as an example with reference to FIG. 13.

Referring to FIG. 13, the light shielding layer 303 is disposed on the substrate 10. The light shielding layer 303 serves to block external light to prevent generation of photo current in transistors. A buffer layer 305 is disposed on the light shielding layer 303. The buffer layer 305 serves to protect transistors formed through the subsequent process from particles such as alkali ions leaking from the light shielding layer 303. The buffer layer 305 may be formed of a silicon oxide (SiOx), a silicon nitride (SiNx) or a multi-layer thereof.

A semiconductor layer 310 of the driving transistor 235 is disposed on the buffer layer 305. The semiconductor layer 310 may be formed of a silicon semiconductor, an oxide semiconductor or an organic semiconductor. The silicon semiconductor may be amorphous silicon or polysilicon obtained by crystallizing the amorphous silicon. The oxide semiconductor may be one of zinc oxide (ZnO), indium zinc oxide (InZnO), indium gallium zinc oxide (InGaZnO) and zinc tin oxide (ZnSnO). The organic semiconductor may be a low molecular or high molecular organic material such as merocyanine, phthalocyanine, pentacene or thiophene polymer. The semiconductor layer 310 includes drain and source regions containing a p-type or n-type impurity, and a channel interposed therebetween.

A gate insulating layer 315 is disposed on the semiconductor layer 310. The gate insulating layer 315 may be formed of a silicon oxide (SiOx), a silicon nitride (SiNx) or a multi-layer thereof. A gate electrode 320 is disposed on a region of the gate insulating layer 315 which corresponds to a predetermined region of the semiconductor layer 310, that is, the channel when impurities have been injected. The gate electrode 320 is formed of one selected from a group consisting of molybdenum (Mo), aluminum (Al), chrome (Cr), gold (Au), titanium (Ti), nickel (Ni), neodymium (Nd) and copper (Cu), or an alloy thereof. Further, the gate electrode 320 may be a multi-layer formed of elements selected from a group consisting of molybdenum (Mo), aluminum (Al), chrome (Cr), gold (Au), titanium (Ti), nickel (Ni), neodymium (Nd) and copper (Cu), or alloys thereof. For example, the gate electrode 320 may be a double layer of molybdenum/aluminum-neodymium or molybdenum/aluminum.

An interlevel insulating layer 325 for insulating the gate electrode 320 is disposed on the gate electrode 320. The interlevel insulating layer 325 may be formed of a silicon oxide (SiOx), a silicon nitride (SiNx) or a multi-layer thereof. A source electrode 330 and a drain electrode 335 are disposed on the interlevel insulating layer 325. The source electrode 330 and the drain electrode 335 are connected to the semiconductor layer 310 through contact holes 337 that expose the source and drain regions of the semiconductor layer 310. The source electrode 330 and the drain electrode 335 may be formed from a single layer or multi-layer. When the source electrode 330 and the drain electrode 335 are formed from a single layer, they may be formed of one selected from a group consisting of molybdenum (Mo), aluminum (Al), chrome (Cr), gold (Au), titanium (Ti), nickel (Ni), neodymium (Nd) and copper (Cu), or an alloy thereof. Further, when the source electrode 330 and the drain electrode 335 are formed from a multi-layer, they may be formed from a double layer of molybdenum/aluminum-neodymium or a triple-layer of titanium/aluminum/titanium, molybdenum/aluminum/molybdenum or molybdenum/aluminum-neodymium/molybdenum. The first data line 236 is disposed separately from the driving transistor 235 and the cathode power supply line 244 is also disposed separated from the driving transistor 235.

Accordingly, the driving transistor 235 including the semiconductor layer 310, the gate electrode 320, the source electrode 330 and the drain electrode 335 is formed.

A passivation layer 340 is disposed on the substrate 10 including the driving transistor 235. The passivation layer 340 is an insulating layer for protecting elements disposed thereunder and may be formed of a silicon oxide (SiOx), a silicon nitride (SiNx) or a multi-layer thereof. The passivation layer 340 includes a first via hole 342 for exposing the drain electrode 335 of the driving transistor 235 disposed thereunder and a second via hole 343 for exposing the cathode power supply line 244.

An overcoat layer 350 is disposed on the passivation layer 340. The overcoat layer 350 may be a planarization layer for planarizing an uneven surface of the structure disposed thereunder and is made of an organic material such as polyimide, benzocyclobutene series resin or acrylate. The overcoat layer 350 includes a third via hole 352 for exposing the first via hole 342 of the passivation layer 340 to expose the drain electrode 335 and a fourth via hole 354 for exposing the second via hole 343 of the passivation layer 340 to expose the cathode power supply line 244.

The OLED is formed on the overcoat layer 350. The OLED 260 includes the first electrode 30 connected to the driving transistor 235, the second electrode 60 opposite the first electrode 30, and the organic emission layer 50 interposed between the first electrode 30 and the second electrode 60. The first electrode 30 may be an anode and the second electrode 60 may be a cathode.

The first electrode 30 may be disposed on the overcoat layer 350 and connected to the drain electrode 335 of the driving transistor 235 through the third via hole 352 of the overcoat layer 350 and the first via hole 342 of the passivation layer 340. The first electrode 30 can be allocated per sub-pixel but the present disclosure is not limited thereto. The first electrode 30 may be formed of a transparent conductive material such as indium tin oxide (ITO), indium zinc oxide (IZO) or zinc oxide (ZnO) in response to an adopted emission method to serve as a transparent electrode or may include a reflective layer to serve as a reflective electrode. The reflective layer may be formed of aluminum (Al), copper (Cu), silver (Ag), nickel (Ni) or an alloy thereof. Desirably, the reflective layer may be formed of APC (silver/palladium/copper alloy).

A connection pattern 365 connected to the cathode power supply line 244 through the fourth via hole 354 of the overcoat layer 350 and the second via hole 343 of the passivation layer 240 is disposed on the overcoat layer 350 separately from the first electrode 30. The connection pattern 365 is formed in the same structure as the first electrode 30.

The bank 40 is disposed on the substrate 10 on which the first electrode 30 is formed. The bank 40 includes the first bank 41 and the second bank 43. The first bank 41 includes the first opening OA1 for exposing the first electrode 30 and the second bank 43 includes the second opening OA2 for exposing a part of the first bank 41 and the first electrode 30. The second opening OA2 may be formed in a larger area than the first opening OA1 to expose a part of the first bank 41.

In addition, the first bank 41 includes a third opening OA3 for exposing the connection pattern 365 and the second bank 43 includes a fourth opening OA4 for exposing a part of the first bank 41 and the connection pattern 365. The fourth opening OA4 may be formed in a larger area than the third opening OA3 to expose a part of the first bank 41.

The organic emission layer 50 is disposed on the substrate 10 on which the bank 40 is formed. The organic emission layer 50 includes an emission layer (EL) and may further include one or more of a hole injection layer (HIL), a hole transport layer (HTL), an electron transport layer (ETL) and an electron injection layer (EIL). The organic emission layer 50 may be coated and dried through a solution process such as inkjet printing or nozzle coating such that the surface of the organic emission layer 50 in contact with the bank 40 can be rounded.

The second electrode 60 is disposed on the organic emission layer 50. The second electrode 60 may be formed on the overall surface of the substrate 10. The second electrode 60 may serve as a transparent electrode or a reflective electrode in response to an adopted emission method. When the second electrode 60 is a transparent electrode, the second electrode 60 may be formed of a transparent conductive material such as ITO and IZO or formed using a thin film of magnesium (Mg), calcium (Ca), aluminum (Al), silver (Ag) or an alloy thereof, which can allow light to pass therethrough. The second electrode 60 is connected to the cathode power supply line 244 by being connected to the connection pattern 365 through the third opening OA3 of the first bank 41 and the fourth opening OA4 of the second bank 43.

A counter substrate 13 is disposed facing the substrate 10 on which the driving transistor 235 and the OLED 260 are formed. The counter substrate 13 serves to seal up the substrate 10 and includes a color filter 395 provided thereon. The color filter 395 may be a red color filter and serves to emphasize color coordinates of red. For example, when the first sub-pixel is a red sub-pixel, the counter substrate 13 may include a red color filter disposed in a region corresponding to the first sub-pixel. In addition, regions of the counter substrate 13 which correspond to the second sub-pixel that is a green sub-pixel and the third sub-pixel that is a blue sub-pixel may not include any color filter. However, the present disclosure is not limited thereto and each sub-pixel may include a color filter in a color corresponding thereto. The structure shown in FIG. 13 can be equally applied to other sub-pixels in addition to the corresponding sub-pixel.

Figure 14:
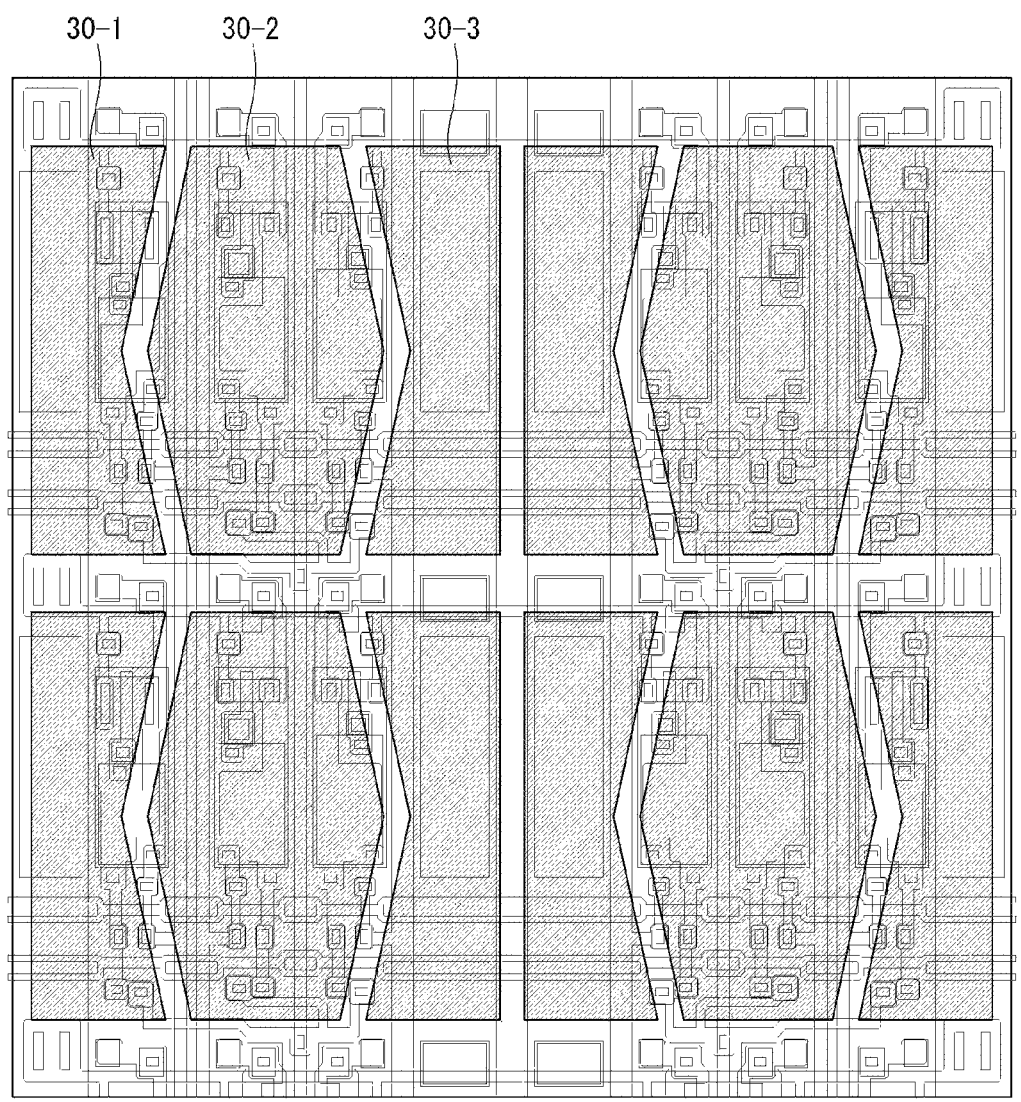
FIG. 14 is a diagram for describing a positional relationship of first electrodes.
Figure 15:
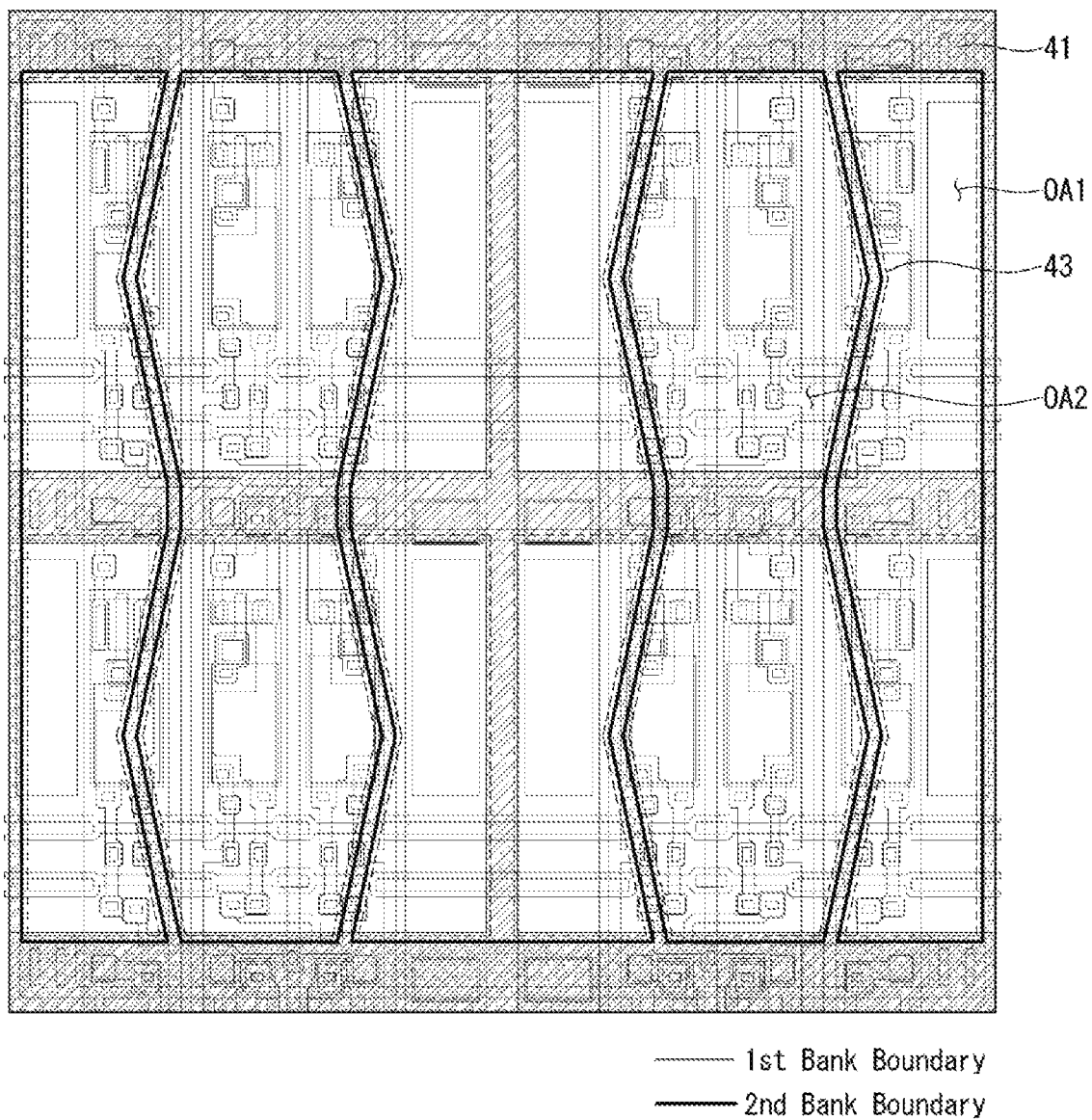
FIG. 15 is a diagram for describing a positional relationship of banks.

FIG. 14 is a diagram for describing a positional relationship of the first electrodes. FIG. 15 is a diagram for describing a positional relationship of the banks.

Referring to FIG. 14, the first electrodes 30 include (1-1)-th electrodes 30-1, (1-2)-th electrodes 30-2 and (1-3)-th electrodes 30-3. The planar shape of the (1-1)-th electrode 30-1 has a first concave portion CC formed on one side thereof neighboring the (1-2)-th electrode 30-2. The planar shape of the (1-2)-th electrode 30-2 has a first convex portion CV formed on one side thereof neighboring the (1-1)-th electrode 30-1 and a second convex portion CV formed on the other side neighboring the (1-3)-th electrode 30-3. The planar shape of the (1-3)-th electrode 30-3 has a second concave portion CC formed on one side thereof neighboring the (1-2)-th electrode 30-2. The first convex portion CV faces the first concave portion CC and the second convex portion CV faces the second concave portion CC.

The (1-1)-th electrode 30-1 is electrically connected to the driving transistor of a (3n-2)-th sub-pixel. The (1-2)-th electrode 30-2 is electrically connected to the driving transistor of a (3n-1)-th sub-pixel. The (1-3)-th electrode 30-3 is electrically connected to the driving transistor of a 3n-th sub-pixel. The via holes 342 and 352 (FIG. 13) for connecting the first electrode 30 and the driving transistors may be formed to overlap the first bank 41 extending in the row direction.

Referring to FIG. 15, the bank 40 includes the first bank 41 and the second bank 43. The first bank 41 includes the first openings OA1 for exposing a plurality of first electrodes 30. The first bank 41 is disposed between first electrodes 30 neighboring in the column direction and disposed between the (1-3)-th electrode 30-3 and the (1-1)-th electrode 30-1 which neighbor each other.

The second bank 43 includes the second openings OA2 for exposing a plurality of first electrodes 30. The second bank 43 is disposed between (1-1)-th electrodes 30-1 disposed in a (3n-2)-th column and (1-2)-th electrodes 30-2 which are disposed in a (3n-1)-th column and neighbor the (1-1)-th electrodes 30-1 and disposed between (1-2)-th electrodes 30-2 disposed in the (3n-1)-th column and (1-3)-th electrodes 30-3 which are disposed in a 3n-th column and neighbor the (1-2)-th electrodes 30-2. Here, the second bank 43 may cross the storage capacitors 240 allocated to sub-pixels in a direction in which the second bank 43 extends.

Those skilled in the art will appreciate that various modifications and variations can be made in the present disclosure without departing from the spirit or scope of the disclosure through the above description. Accordingly, the technical scope of the present disclosure should not be limited to the detailed description of the specification but should be determined by the claims.

What is claimed is:

1. An organic light emitting display device comprising:
    a substrate on which a plurality of sub-pixels is arranged in a column direction and a row direction;
    a plurality of first electrodes allocated to the plurality of sub-pixels;
    a first bank disposed on the first electrodes and having a plurality of first openings that exposes the plurality of first electrodes; and
    a second bank disposed on the first bank and having a plurality of second openings that exposes the plurality of first electrodes and a part of the first bank,
    wherein the plurality of first electrodes include a plurality of (1-1)-th electrodes arranged in a (3n-2)-th column, a plurality of (1-2)-th electrodes arranged in a (3n-1)-th column and a plurality of (1-3)-th electrodes arranged in a 3n-th column, where n is a natural number equal to or greater than 1,
    wherein the first bank is disposed between the plurality of first electrodes neighboring in the column direction and disposed between the (1-3)-th electrodes and the (1-1)-th electrodes neighboring in the row direction,
    wherein the second bank is disposed between the plurality of (1-1)-th electrodes arranged in the (3n-2)-th column and the plurality of (1-2)-th electrodes neighboring the plurality of (1-1)-th electrodes and arranged in the (3n-1)-th column and disposed between the plurality of (1-2)-th electrodes arranged in the (3n-1)-th column and the plurality of (1-3)-th electrodes neighboring the plurality of (1-2)-th electrodes and arranged in the 3n-th column,
    wherein the second bank is not disposed between the plurality of (1-3)-th electrodes arranged in the 3n-th column and the plurality of (1-1)-th electrodes neighboring the plurality of (1-3)-th electrodes in the row direction and arranged in the (3n-2)-th column,
    wherein each (1-1)-th electrode has a first concave portion formed on one side thereof neighboring the (1-2)-th electrode, each (1-2)-th electrode has a first convex portion formed on one side thereof neighboring the (1-1)-th electrode and a second convex portion formed on the other side neighboring the (1-3)-th electrode, and each (1-3)-th electrode has a second concave portion formed on one side thereof neighboring the (1-2)-th electrode, the first concave portion faces the first convex portion and the second concave portion faces the second convex portion,
    wherein the (1-1)-th electrode includes a first part decreasing in width in the row direction in the column direction, and a second part extending from the first part and increasing in width in the row direction in the column direction, and
    wherein the first part and the second part have a planar shape of a right-angled trapezoid.

2. The organic light emitting display device of claim 1, wherein the plurality of second openings simultaneously expose the (1-3)-th electrodes arranged in the 3n-th column and the (1-1)-th electrodes neighboring the (1-3)-th electrodes in the row direction and arranged in the (3n-2)-th column.

3. The organic light emitting display device of claim 1, further comprising organic emission layers respectively disposed in the plurality of second openings,
    wherein the organic emission layers include a first organic emission layer emitting light in a first color, a second organic emission layer emitting light in a second color, and a third organic emission layer emitting light in a third color.

4. The organic light emitting display device of claim 3, wherein the second openings include (2-1)-th, (2-2)-th, (2-3)-th, (2-4)-th, (2-5)-th, (2-6)-th and (2-7)-th openings arranged in the row direction, and
    wherein the (2-1)-th opening exposes the (1-1)-th electrodes arranged in a first column, the (2-2)-th opening exposes the (1-2)-th electrodes arranged in a second column, the (2-3)-th opening simultaneously exposes the (1-3)-th electrodes arranged in a third column and the (1-1)-th electrodes arranged in a fourth column, the (2-4)-th opening exposes the (1-2)-th electrodes arranged in a fifth column, the (2-5)-th opening simultaneously exposes the (1-3)-th electrodes arranged in a sixth column and the (1-1)-th electrodes arranged in a seventh column, the (2-6)-th opening exposes the (1-2)-th electrodes arranged in an eighth column, and the (2-7)-th openings expose the (1-3)-th electrodes disposed in a ninth column.

5. The organic light emitting display device of claim 4, wherein the first organic emission layer is disposed in the (2-1)-th opening and the (2-5)-th opening, the second organic emission layer is disposed in the (2-2)-th opening, the (2-4)-th opening and the (2-6)-th opening, and the third organic emission layer is disposed in the (2-3)-th opening and the (2-7)-th opening.

6. The organic light emitting display device of claim 3, wherein the organic emission layers disposed in the second openings cover the first electrodes and the part of the first bank exposed through the second openings.

7. The organic light emitting display device of claim 1, wherein the first part and the second part are symmetrical with respect to a virtual reference line extending in the row direction.

8. The organic light emitting display device of claim 1, wherein the (1-2)-th electrode includes a first part increasing in width in the row direction in the column direction, and a second part extending from the first part and decreasing in width in the row direction in the column direction.

9. The organic light emitting display device of claim 8, wherein the first part and the second part have a planar shape of an isosceles trapezoid.

10. The organic light emitting display device of claim 8, wherein the first part and the second part are symmetrical with respect to a virtual reference line extending in the row direction.

11. The organic light emitting display device of claim 1, wherein the (1-3)-th electrode includes a first part decreasing in width in the row direction in the column direction, and a second part extending from the first part and increasing in width in the row direction in the column direction.

12. The organic light emitting display device of claim 11, wherein the first part and the second part have a planar shape of a right-angled trapezoid.

13. The organic light emitting display device of claim 11, wherein the first part and the second part are symmetrical with respect to a virtual reference line extending in the row direction.

14. The organic light emitting display device of claim 1, wherein the (1-1)-th electrode and the (1-3)-th electrode neighboring each other are axially symmetrical with respect to a virtual reference line extending in the column direction.

15. The organic light emitting display device of claim 1, wherein the sub-pixels are sequentially alternately arranged in the row direction in units of a group,
wherein the group comprises a first sub-pixel emitting light in a first color, a second sub-pixel emitting light in a second color, a third sub-pixel emitting light in a third color, a fourth sub-pixel emitting light in the third color, a fifth sub-pixel emitting light in the second color, and a sixth sub-pixel emitting light in the first color sequentially arranged in the row direction.

16. The organic light emitting display device of claim 1, wherein the first bank has hydrophilicity and the second bank has hydrophobicity.

17. The organic light emitting display device of claim 1, wherein parts of the first electrodes exposed by the first bank and the second bank are defined as emission regions, and the planar shape of the emission regions correspond to the planar shape of the first electrodes.

18. The organic light emitting display device of claim 1, wherein the first openings are disposed in parallel in the column direction and the row direction, and the first openings simultaneously expose the (1-1)-th, (1-2)-th and (1-3)-th electrodes.

19. The organic light emitting display device of claim 1, wherein the second bank extends zigzag in the column direction.

20. The organic light emitting display device of claim 1, wherein the second openings are arranged in parallel in the row direction and extend in the column direction.

21. The organic light emitting display device of claim 1, wherein sub-pixels consecutively disposed in the row direction emit lights in different colors and sub-pixels consecutively disposed in the column direction emit lights in the same color.

* * * * *